United States Patent
Cho

(10) Patent No.: US 12,406,864 B2
(45) Date of Patent: Sep. 2, 2025

(54) SUSCEPTOR

(71) Applicant: MiCo Ceramics Ltd., Anseong-si (KR)

(72) Inventor: Hyung-Jun Cho, Anseong-si (KR)

(73) Assignee: MiCo Ceramics Ltd., Anseong-si (KR)

(*) Notice: Subject to any disclaimer, the term of this patent is extended or adjusted under 35 U.S.C. 154(b) by 0 days.

(21) Appl. No.: 18/929,747

(22) Filed: Oct. 29, 2024

(65) Prior Publication Data

US 2025/0140582 A1    May 1, 2025

(30) Foreign Application Priority Data

Oct. 30, 2023 (KR) .......................... 10-2023-0146632

(51) Int. Cl.
| | | |
|---|---|---|
| H01L 21/67 | (2006.01) | |
| H05B 3/14 | (2006.01) | |
| H05B 3/18 | (2006.01) | |

(52) U.S. Cl.
CPC ....... *H01L 21/67098* (2013.01); *H05B 3/143* (2013.01); *H05B 3/18* (2013.01)

(58) Field of Classification Search
CPC ................................. H05B 3/143; H05B 3/18
See application file for complete search history.

(56) References Cited

U.S. PATENT DOCUMENTS

| | | | |
|---|---|---|---|
| 6,617,553 B2 | 9/2003 | Ho et al. | |
| 7,279,661 B2 | 10/2007 | Okajima et al. | |
| 9,888,528 B2 | 2/2018 | Matsushita et al. | |
| 11,430,686 B2 | 8/2022 | Ulavi et al. | |
| 11,956,863 B2 | 4/2024 | Unno et al. | |
| 11,984,329 B2 | 5/2024 | Ishikawa et al. | |
| 2004/0155025 A1 | 8/2004 | Ito et al. | |
| 2004/0188413 A1 | 9/2004 | Natsuhara et al. | |
| 2005/0258160 A1 | 11/2005 | Goto et al. | |
| 2022/0174788 A1* | 6/2022 | Hara | H05B 3/18 |
| 2022/0254662 A1* | 8/2022 | Matsushita | H05B 3/265 |
| 2022/0377850 A1 | 11/2022 | Akao et al. | |

FOREIGN PATENT DOCUMENTS

| | | |
|---|---|---|
| CN | 114585114 A | 6/2022 |
| JP | 2003133195 A | 5/2003 |
| JP | 2013026428 A | 2/2013 |

(Continued)

OTHER PUBLICATIONS

KR 102561807 B1 (Jin Jung Chul) Aug. 1, 2023 [retrieved on Jan. 3, 2025]. Retrieved from Foreign Image and Text database, translation by Clarivate Analytics (Year: 2023).*

(Continued)

*Primary Examiner* — Edward F Landrum
*Assistant Examiner* — Theodore J Evangelista
(74) *Attorney, Agent, or Firm* — NKL Law; Jae Youn Kim

(57) ABSTRACT

The present disclosure relates to a susceptor, and a susceptor of the present disclosure may improve temperature uniformity over the entire area of the upper surface of the susceptor by arranging a heater pattern of a multilayer structure so that arcs thereof do not overlap or so that the straight sections of the heater are arranged at different angles with respect to the center in different layers, or by arranging the straight sections of the heater at different angles with respect to the center even in a heater pattern of a single-layer structure.

14 Claims, 15 Drawing Sheets

(56) References Cited

FOREIGN PATENT DOCUMENTS

| | | | | | |
|---|---|---|---|---|---|
| JP | 2021174703 | A | 11/2021 | | |
| KR | 20010083893 | A | 9/2001 | | |
| KR | 20050054952 | A | 6/2005 | | |
| KR | 20080037879 | A | 5/2008 | | |
| KR | 20120009572 | A | 2/2012 | | |
| KR | 20200120720 | A | 10/2020 | | |
| KR | 20220076329 | A | 6/2022 | | |
| KR | 20220078678 | A | 6/2022 | | |
| KR | 102425944 | B1 | 7/2022 | | |
| KR | 20220113258 | A | 8/2022 | | |
| KR | 20220124780 | A | 9/2022 | | |
| KR | 102561807 | B1 * | 8/2023 | ............... | H05B 3/28 |
| WO | 2020153071 | A1 | 7/2020 | | |

OTHER PUBLICATIONS

Notice of Allowance of JPO for Japanese application No. 2023-217982, dated Jul. 2, 2024.

Office Action of JPO for Japanese application No. 2023-217982, dated Mar. 26, 2024.

\* cited by examiner

Prior Art

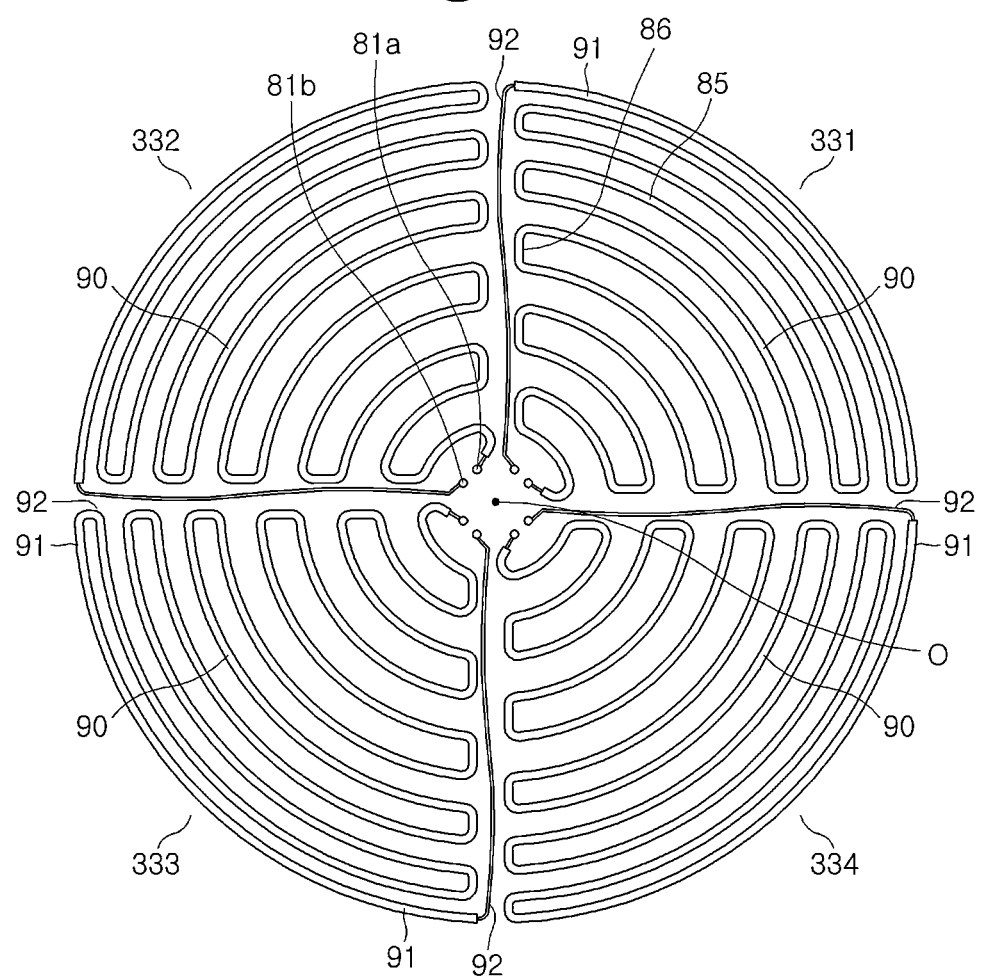

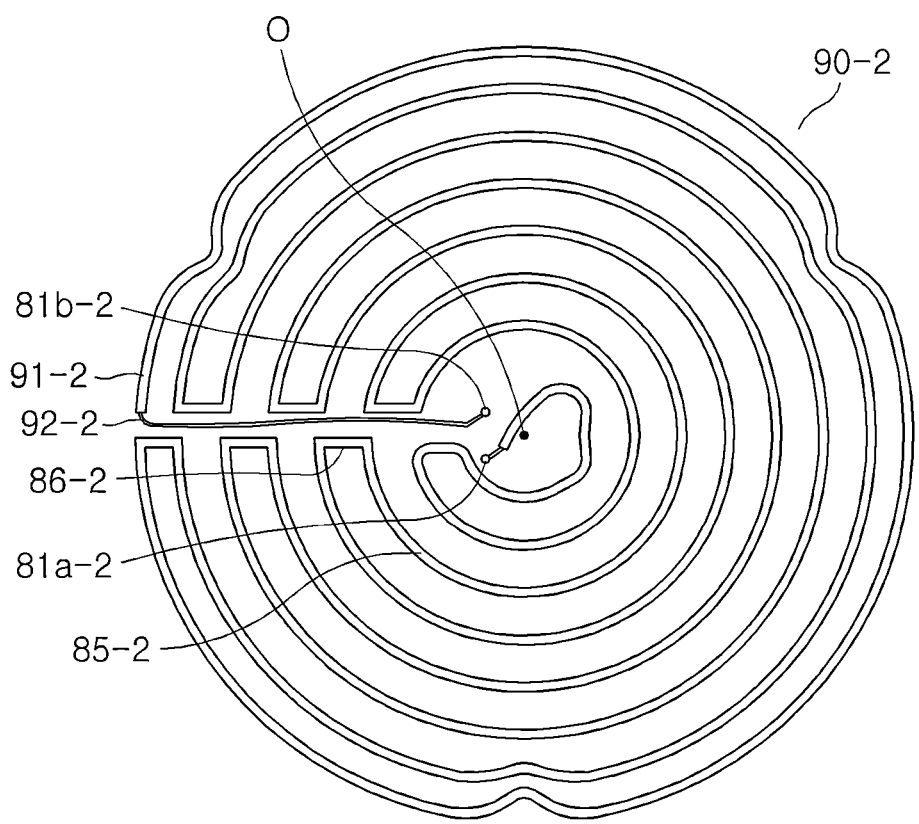

511 ARRANGEMENT AREAS

512 ARRANGEMENT AREAS

513

SUSCEPTOR

CROSS-REFERENCE TO RELATED APPLICATION(S)

This application is based on and claims priority under 35 U.S.C. 119 to Korean Patent Application No. 10-2023-0146632, filed on Oct. 30, 2023, in the Korean Intellectual Property Office, the disclosure of which is herein incorporated by reference in its entirety.

BACKGROUND OF THE INVENTION

1. Field of the Invention

The present disclosure relates to a susceptor and, more particularly, to a susceptor having a heater pattern applied thereto to improve temperature uniformity.

2. Description of the Prior Art

In general, semiconductor devices or display devices are manufactured by sequentially stacking a plurality of thin film layers including dielectric layers and metal layers on a glass substrate, flexible substrate, or semiconductor wafer substrate, and then patterning them. These thin film layers are sequentially deposited on the substrate through chemical vapor deposition (CVD) processes or physical vapor deposition (PVD) processes. The CVD processes include a low-pressure CVD (LPCVD) process, a plasma-enhanced CVD (PECVD) process, and a metal organic CVD (MOCVD) process. A ceramic susceptor is disposed in such CVD devices and PVD devices in order to support the glass substrate, flexible substrate, semiconductor wafer substrate, or the like and generate a certain amount of heat or plasma by a radio frequency (RF) electrode. The ceramic susceptor is widely used in plasma deposition processes or the like for precise processes such as fine wiring of semiconductor devices, in order to meet the requirements of precise temperature control and heat treatment, and is also used for generating plasma or heating a substrate in etching processes of thin film layers formed on the semiconductor wafer substrate or in photoresist curing processes.

A typical ceramic susceptor includes a heating element, which functions as a heater, disposed between ceramic materials. In the ceramic susceptor structure, the heater receives power and generates heat to heat the semiconductor wafer substrate or the like, and temperature uniformity of the substrate is important for improving yield through stable semiconductor processes.

FIG. 1A is a plan view of a heater pattern of a conventional ceramic susceptor.

Referring to FIG. 1A, a conventional ceramic susceptor generally has an inner heater pattern 10 and an outer heater pattern 20 in the diametric direction on the same plane, and the inner heater pattern 10 extends in an arc between a first terminal pair 10a and 10b at the center, and the outer heater pattern 20 extends in an arc between a second terminal pair 20a and 20b at the center.

However, since the conventional ceramic susceptor has the inner heater pattern 10 and outer heater pattern 20 formed on the same plane in the same layer, a method is attempted, in the case where the temperature of the upper surface of the susceptor on which the substrate is placed is not uniform over the entire area, to improve the temperature uniformity by adjusting the pitch of the heaters to increase or reduce the temperature of the corresponding portion.

In addition, in the conventional ceramic susceptor, one ends of the straight sections 21a and 21b are connected to the second terminal pair 20a and 20b, and the other ends extend to two connection points of the outer heater pattern 20 having a resistance pattern, so that the outer heater pattern 20 is configured to be connected to the second terminal pair 20a and 20b. As a result, the straight sections 21a and 21b of the heater, which are spaced a small distance apart from each other, in the conventional ceramic susceptor may have defects such as cracks due to oxidation, as shown in FIG. 1B, which may cause a change in resistance value or a short circuit, affecting temperature uniformity.

SUMMARY OF THE INVENTION

Accordingly, the present disclosure has been made to solve the above-described problems, and aims to provide a susceptor in which multilayer heater patterns are arranged such that arcs thereof do not overlap or such that the straight sections of the heater are arranged at different angles with respect to the center in different layers, or in which the straight sections of the heater are arranged at different angles with respect to the center even in single-layer heater patterns, thereby improving temperature uniformity over the entire area of the upper surface of the susceptor.

According to an aspect of the present disclosure, there is provided a susceptor including an insulating plate having a plurality of heater layers arranged thereon. The plurality of heater layers may include: a first heater layer having a first pattern including a first resistance part and a first connection part connected between a first terminal pair; and a second heater layer having a second pattern including a second resistance part and a second connection part connected between a second terminal pair, and the first connection part may connect an end of the first resistance part and any one terminal of the first terminal pair, and the second connection part may connect an end of the second resistance part and any one terminal of the second terminal pair.

Here, the first connection part and the second connection part may extend in a diametric direction with respect to a center of the insulating plate, and each of the first connection part and the second connection part may be arranged one by one between adjacent resistance part patterns.

Each of the first resistance part and the second resistance part may include a plurality of arcs extending in a circumferential direction and a plurality of bends connecting the arcs, and when the arcs of the first resistance part and the arcs of the second resistance part are projected onto a plane of the insulating plate, the arcs of the second resistance part may be arranged between the arcs of the first resistance part.

Here, the first connection part and the second connection part may be arranged at positions of radially different angles with respect to the center of the insulating plate.

The plurality of heater layers may further include a third heater layer having a third pattern including a third resistance part and a third connection part connected between a third terminal pair, and the third connection part may connect an end of the third resistance part and any one terminal of the third terminal pair, and the third resistance part may include a plurality of arcs extending in the circumferential direction and a plurality of bends connecting the arcs.

When the arcs of the first resistance part, the arcs of the second resistance part, and the arcs of the third resistance part are projected onto a plane of the insulating plate, the arcs of the third resistance part may be arranged between the arcs of the first resistance part and second resistance part.

The first connection part, the second connection part, and the third connection part may be arranged at positions of radially different angles with respect to the center of the insulating plate.

The first pattern and the second pattern may be arranged in one or more arrangement areas, which are divided into the same number of parts, respectively.

The first pattern and the second pattern may be arranged in one or more arrangement areas, which are divided into different numbers of parts, respectively.

Each of the first connection part and the second connection part may include a connecting wire having a wave shape.

In addition, according to another embodiment of the present disclosure, each of the first resistance part and the second resistance part may include a plurality of arcs extending in the circumferential direction and a plurality of bends connecting the arcs, and the one or more first patterns and the one or more second patterns may be arranged in different arrangement areas without overlapping each other between layers, and may include the arcs that are symmetrical about the center and the bends that are symmetrical about the center, and the first connection part and the second connection part may be arranged at positions of radially different angles with respect to the center.

It is preferable that two connection parts of the first heater layer are arranged at 180 degrees with each other in an outer diametric direction, that two connection parts of the second heater layer are arranged at 180 degrees with each other in the outer diametric direction, and that extension lines of two connection parts of the first heater layer and extension lines of two connection parts of the second heater layer are perpendicular to each other.

According to another aspect of the present disclosure, a susceptor may include an insulating plate on which a heater is arranged, wherein the heater may include patterns arranged in a plurality of divided arrangement areas, respectively, on the same plane, and each pattern may include a resistance part and a connection part connected between a terminal pair, and each connection part may connect an end of the resistance part connected to a first terminal and a second terminal.

Each resistance part may include a plurality of arcs extending in the circumferential direction and a plurality of bends connecting the arcs.

The connection parts of the patterns may be arranged at position of radially different angles from each other with respect to the center of the insulating plate.

According to the susceptor of the present disclosure, the temperature uniformity may be improved by arranging the multilayer heater patterns such that the arcs do not overlap, so that the heater is evenly distributed over respective areas for heating, and the temperature uniformity may be improved in the entire area of the upper surface of the susceptor by arranging multiple connecting wires, which are straight sections between layers, not to overlap each other or not to be parallel to each other in the multilayer heater patterns or by arranging two or more connecting wires, which are straight sections, at different angles with respect to the center in the single-layer heater patterns.

In addition, such a structure is able to reduce the occurrence of defects such as cracks due to oxidation of the connecting wires, which are straight sections, and the temperature is able to be freely controlled in each arrangement area in each layer of the multilayer heater patterns, thereby increasing the degree of freedom of temperature control for temperature uniformity.

BRIEF DESCRIPTION OF THE DRAWINGS

The accompanying drawings, which are included as part of the detailed description to aid understanding of the present disclosure, provide embodiments of the present disclosure and, along with the detailed description, explain the technical ideas of the present disclosure.

FIGS. 3A to 3D are drawings illustrating various patterns in a single-layer structure as examples of heater patterns of a susceptor according to the present disclosure.

FIGS. 5A to 5D are drawings illustrating an exemplary two-layer structure of heater patterns of a susceptor according to the present disclosure.

DETAILED DESCRIPTION OF THE EXEMPLARY EMBODIMENTS

Figure 1A:
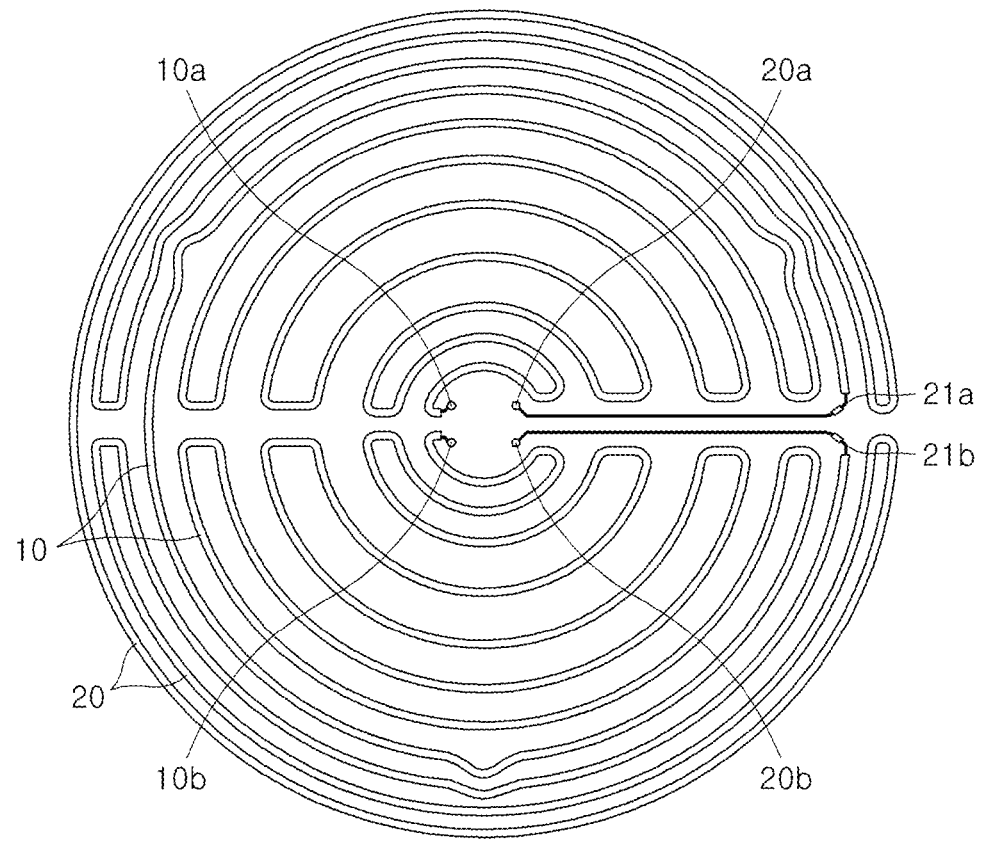
FIG. 1A is a plan view of heater patterns of a conventional susceptor.
Figure 1B:
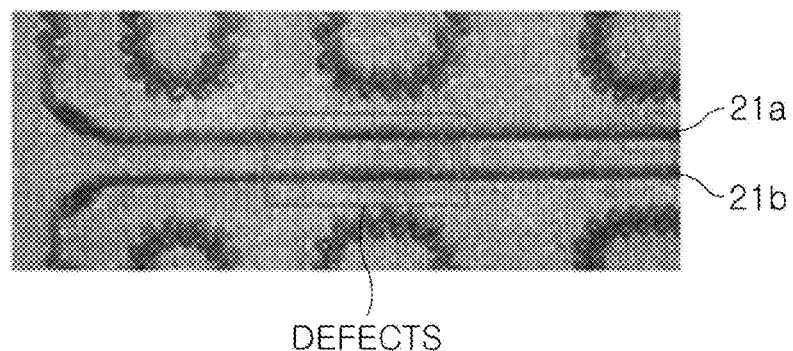
FIG. 1B shows an example of defects in a straight section of a heater in a conventional susceptor.

Hereinafter, the present disclosure will be described in detail with reference to the attached drawings. Here, the same elements in the respective drawings will be indicated by the same reference numerals. In addition, detailed descriptions of functions and/or configurations that have already been disclosed will be omitted. Hereinafter, descriptions will be made based on the configurations necessary for understanding the operation according to various embodiments, and descriptions of elements that may obscure the subject matter of the disclosure will be omitted. In addition, some elements of the drawings may be exaggerated, omitted, or schematically illustrated. The sizes of respective elements do not entirely reflect the actual sizes, and therefore, the description herein is not limited to the relative sizes or spacing of the elements shown in the drawings.

In explaining the embodiments of the present disclosure, a specific description of the well-known technology related to the present disclosure, which may unnecessarily obscure the subject matter of the present disclosure, will be omitted. In addition, the terms described below are terms defined in consideration of the functions in the present disclosure, and may vary depending on the intention or custom of the user or operator. Therefore, the definitions should be made based on the description throughout this specification. The terms used in the detailed description are intended only to describe embodiments of the present disclosure, instead of restricting the present disclosure. Unless expressly used otherwise, the singular form includes the plural form. In the description, the terms "include" or "is provided" are intended to indicates certain features, numbers, steps, operations, elements, parts, or combinations thereof, and should not be construed to exclude the presence or possibility of one or more other features, numbers, steps, operations, elements, parts, or combinations thereof other than those described.

In addition, although the terms "first" or "second" may be used to describe various elements, the elements are not limited to the terms, and the terms are used only for the purpose of distinguishing one element from another.

Figure 2:
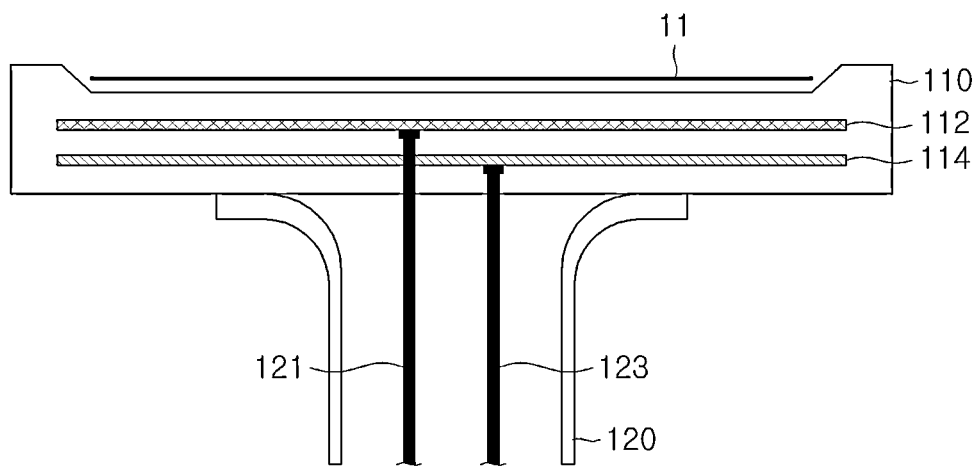
FIG. 2 is a cross-sectional view schematically illustrating a susceptor according to an embodiment of the present disclosure.

FIG. 2 is a cross-sectional view schematically illustrating a susceptor 100 according to an embodiment of the present disclosure.

Referring to FIG. 2, a susceptor 100 according to an embodiment of the present disclosure includes an insulating plate 110 and a shaft 120.

The susceptor 100 according to an embodiment of the present disclosure is a semiconductor device that supports a substrate to be processed for various purposes, such as a semiconductor wafer, a glass substrate, a flexible substrate, etc., and heats the processed substrate to a predetermined temperature. The susceptor 100 may also be used in a semiconductor process that uses plasma, such as plasma-enhanced chemical vapor deposition or dry etching.

The insulating plate 110 may be configured such that a high-frequency electrode 112 for generating plasma and/or a heater 114 for heating a substrate are arranged (embedded) in a ceramic material so as to be spaced a predetermined distance apart from each other. The insulating plate 110 is configured to stably support the substrate to be processed and enable semiconductor processes through heating of the substrate using the heater 114 and/or a plasma using the high-frequency electrode 112.

Although not shown in the drawing, chuck electrodes with an electrostatic chuck function may be further provided in the susceptor 100 of the present disclosure to support the substrate 11 placed on the insulating plate 110. For example, the chuck electrodes may be further configured to be arranged (embedded) above or below the high-frequency electrode 112 or the heater 114 at a predetermined interval.

The insulating plate 110 may be formed as a plate-like structure having a predetermined shape. For example, the insulating plate 110 may be formed as a circular plate-like structure, but is not necessarily limited thereto. Here, the ceramic material may be at least one of $Al_2O_3$, $Y_2O_3$, $Al_2O_3/Y_2O_3$, $ZrO_2$, AlC (autoclaved lightweight concrete), TiN, AlN, TiC, MgO, CaO, $CeO_2$, $TiO_2$, $B_xC_y$, BN, $SiO_2$, SiC, YAG, Mullite, and $AlF_3$, and may be preferably aluminum nitride (AlN). Furthermore, each ceramic powder may optionally contain yttrium oxide powder of 0.1 to 10%, preferably, about 1 to 5%.

The shaft 120 is configured as a pipe having a hollow and is joined or coupled to the lower surface of the insulating plate 110. The shaft 120 may be formed of the same ceramic material as the insulating plate 100 and may be joined or coupled.

The high-frequency electrode 112 or the chuck electrodes may be made of tungsten (W), molybdenum (Mo), silver (Ag), gold (Au), niobium (Nb), titanium (Ti), aluminum nitride (AlN), or an alloy thereof, and preferably, may be made of molybdenum (Mo). The high-frequency electrode 112 may be connected to an RF (radio frequency) power source or the ground through a connecting rod 121 provided inside the hollow shaft 120, and the chuck electrodes may be connected to a power source (DC or AC power) for driving chuck electrodes through another connecting rod provided inside the hollow shaft 120. The high-frequency electrode 112 has a mesh structure of a wire type or sheet type. Here, the mesh structure indicates a net-type structure formed by a plurality of metals arranged in a first direction and a plurality of metals arranged in a second direction, which alternately intersect each other.

The heater 114 is made of tungsten (W), molybdenum (Mo), alloys thereof, or carbides, and has a high melting point and high resistance. The heater 114 may be configured in a plate-like coil shape by a heating wire (or a resistance wire or a heating electrode). In addition, the heater 114 may be formed in a multilayer structure for precise temperature control. This heater 114 may be connected to a power source through a connecting rod 123 provided inside the shaft 120 in a semiconductor manufacturing process, and may perform a function of heating a substrate to be processed on the insulating plate 110 to a predetermined temperature in order to perform an effective deposition process and etching process.

In the susceptor 100 according to an embodiment of the present disclosure, multilayer heater patterns of the heater 114 configured as heating wires (or resistance wires) are arranged such that the arcs thereof do not overlap, as shown in FIGS. 3A to 7, so that the heater is evenly distributed over respective areas for heating, thereby improving the temperature uniformity. In addition, multilayer heater 114 patterns are arranged such that multiple straight sections between layers (connection parts connecting terminals and resistance parts) do not overlap each other or are not parallel to each other in the multilayer heater 114 patterns, thereby further improving the temperature uniformity. In addition, two or more straight sections (connection parts connecting terminals and resistance parts) are arranged at different angles with respect to the center even in the single-layer heater 114 patterns, as shown in FIGS. 3A to 3D, thereby improving the temperature uniformity in the entire area of the upper surface of the susceptor.

Hereinafter, the configurations of the present disclosure above will be described in detail with reference to FIGS. 3A to 7.

Figure 3A:
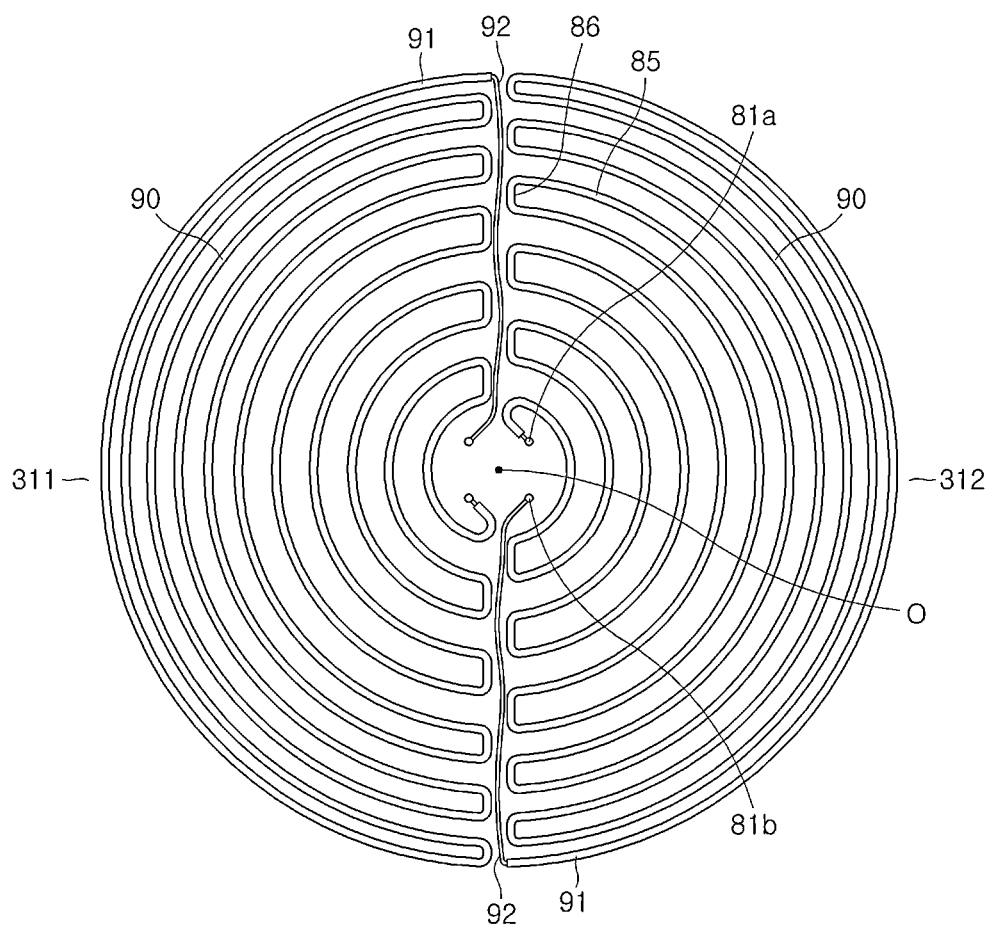
Figure 3B:
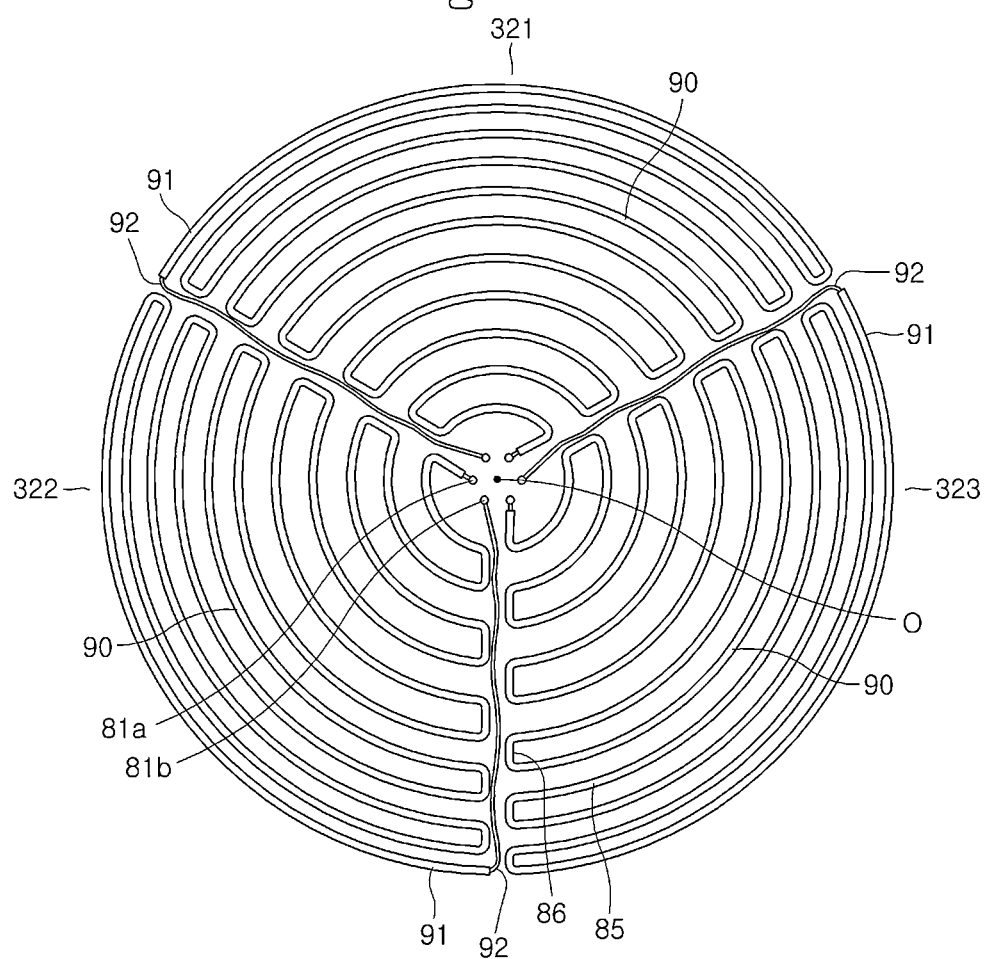
Figure 3D:
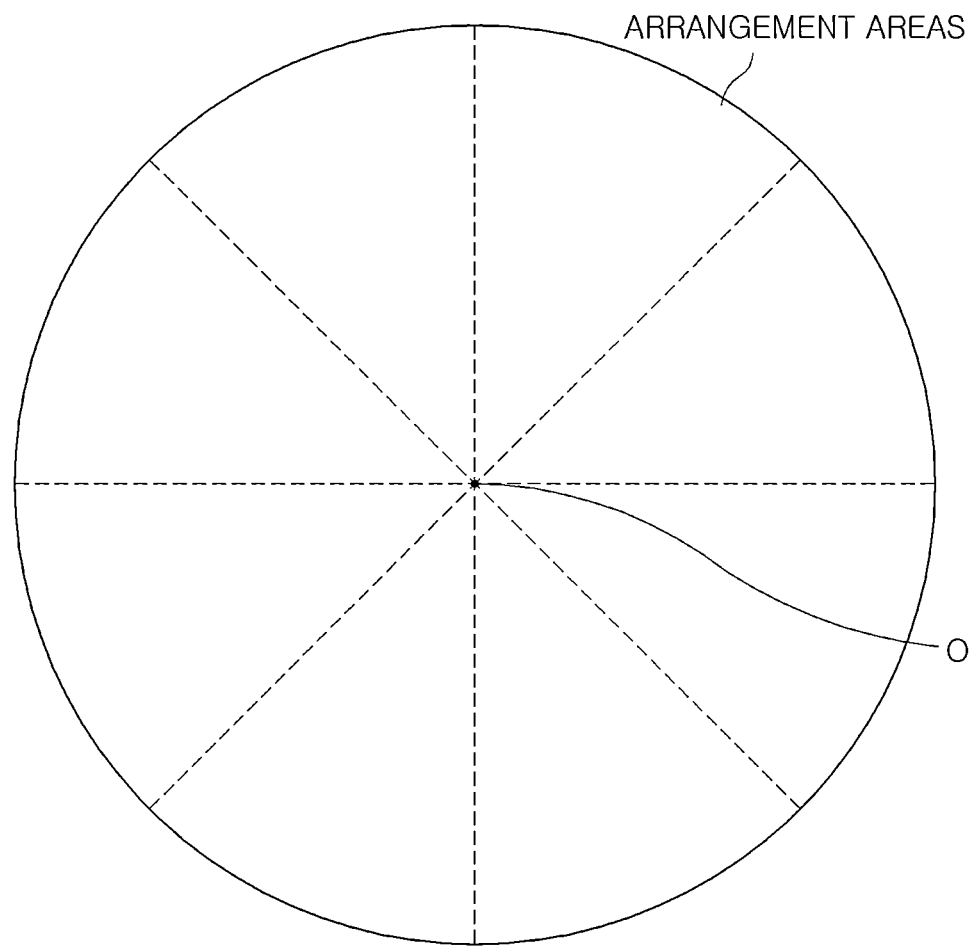

FIGS. 3A to 3D are drawings illustrating various heater 114 patterns in a single-layer structure as examples of heater 114 patterns of a susceptor 100 according to the present disclosure FIGS. 3A to 3D are drawings for explaining various heater 114 patterns of a single-layer structure of an exemplary heater layer (heater layer) of heater 114 patterns of a susceptor 100 of the present disclosure. FIG. 3A illustrates a structure in which heater 114 patterns 90 in a single-layer structure are arranged in bisected arrangement areas 311 and 312, respectively, on a plan view of the susceptor 100. FIG. 3B illustrates a structure in which heater 114 patterns 90 of a single-layer structure are arranged in trisected arrangement areas 321, 322, and 323, respectively, on a plan view of the susceptor 100. FIG. 3C illustrates a structure in which heater 114 patterns 90 of a single-layer structure are arranged in quadrisected arrangement areas 331, 332, 333, and 334, respectively, on a plan view of the susceptor 100. FIG. 3D illustrates a structure in which heater 114 patterns 90 of a single-layer structure are arranged in multiple arrangement areas, which are equally divided, on a plan view of the susceptor 100.

Referring to FIGS. 3A to 3D, the heater 114 may include respective patterns arranged in arrangement areas, which are equally or not equally divided into two or more parts, on the same plane inside the insulating plate 110.

That is, the heater 114 includes respective patterns 90 arranged in the respective arrangement areas divided into multiple parts on the same plane inside the insulating plate 110.

Each pattern 90 includes a resistance part 91 and a connection part 92 connected between a terminal pair 81a and 81b.

Here, each connection part 92 connects an end of the resistance part 91 connected to a first terminal 81a and a second terminal 81b, and each resistance part 91 includes a plurality of arcs 85 extending in the circumferential direction and a plurality of bends 86 connecting the arcs 85.

In addition, the connection parts 92 of the patterns 90 are arranged such that no two connection parts are parallel to each other, and the connection parts 92 of the patterns 90 are arranged at positions of radially different angles with respect to the center. That is, the connection parts 92 of adjacent patterns 90 are not arranged adjacent to each other.

Figure 4:
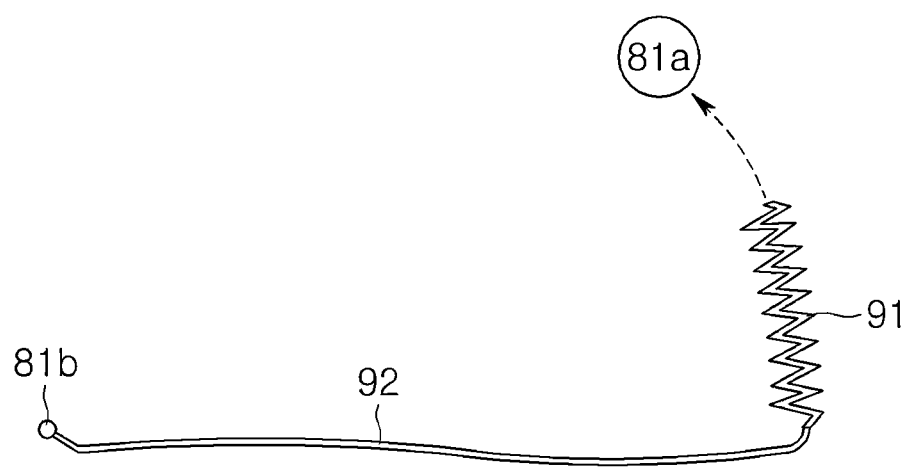
FIG. 4 illustrates a connection part between a terminal and a resistance part in a heater pattern of a susceptor according to the present disclosure.

FIG. 4 illustrates a connection part 92 between a terminal 81b and a resistance part 91 in a heater 114 pattern of a susceptor 100 according to the present disclosure Referring to FIG. 4, the pattern 90 arranged in each of the plurality of divided arrangement areas includes a resistance part 91 and a connection part 92 connected between the terminal pair 81a and 81b, and the connection part 92 includes a connecting wire having a wave shape such as a sine wave.

That is, the wave shape here indicates a shape having at least one portion where a convex downward portion and a convex upward portion are connected, and it is desirable that the curvature of each convex portion be designed to be about R400 to R500. This is intended to increase the curvature to make a gentle curve, thereby reducing defects due to oxidation or the like.

As described above, the resistance part 91 and connection part 92 of the heater 114 are made of tungsten (W), molybdenum (Mo), alloys thereof, or carbides. The resistance part 91 is a part with high resistance obtained by processing the materials of the heater 114 into a coil shape (in some cases, a sawtooth zigzag shape is also possible) to increase the electron movement distance, and the connection part 92 is a connecting wire part for electrical connection.

Hereinafter, the configurations of the patterns 90 of the heater 114, the terminal pair 81a and 81b, the arcs 85, the bends 86, the resistance part 91, and the connection part 92 described above are also applied to a multilayer structure of two or more heater layers in the same manner.

Figure 5A:
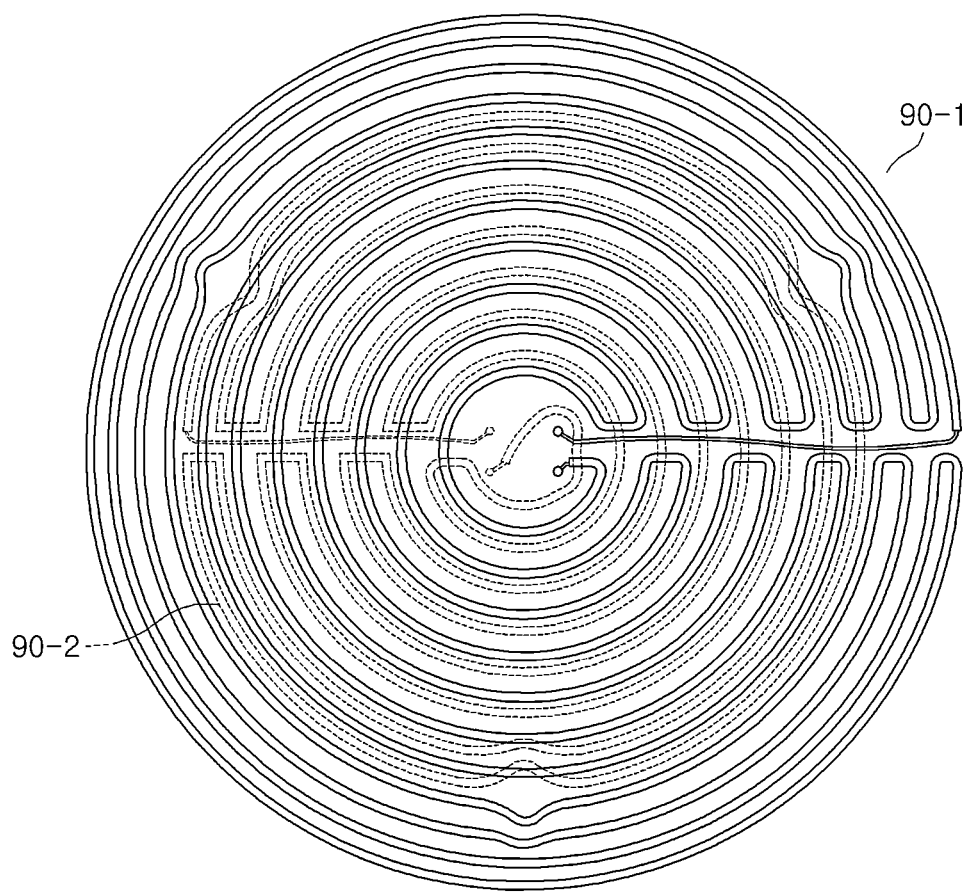
Figure 5B:
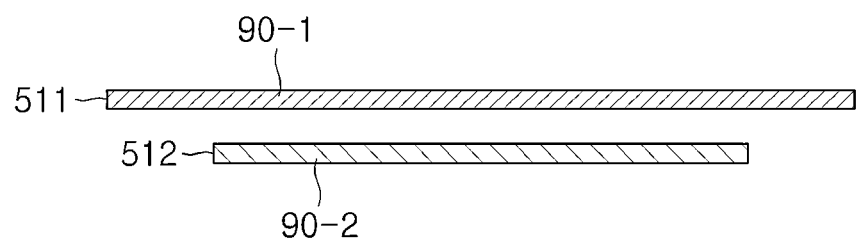
Figure 5C:
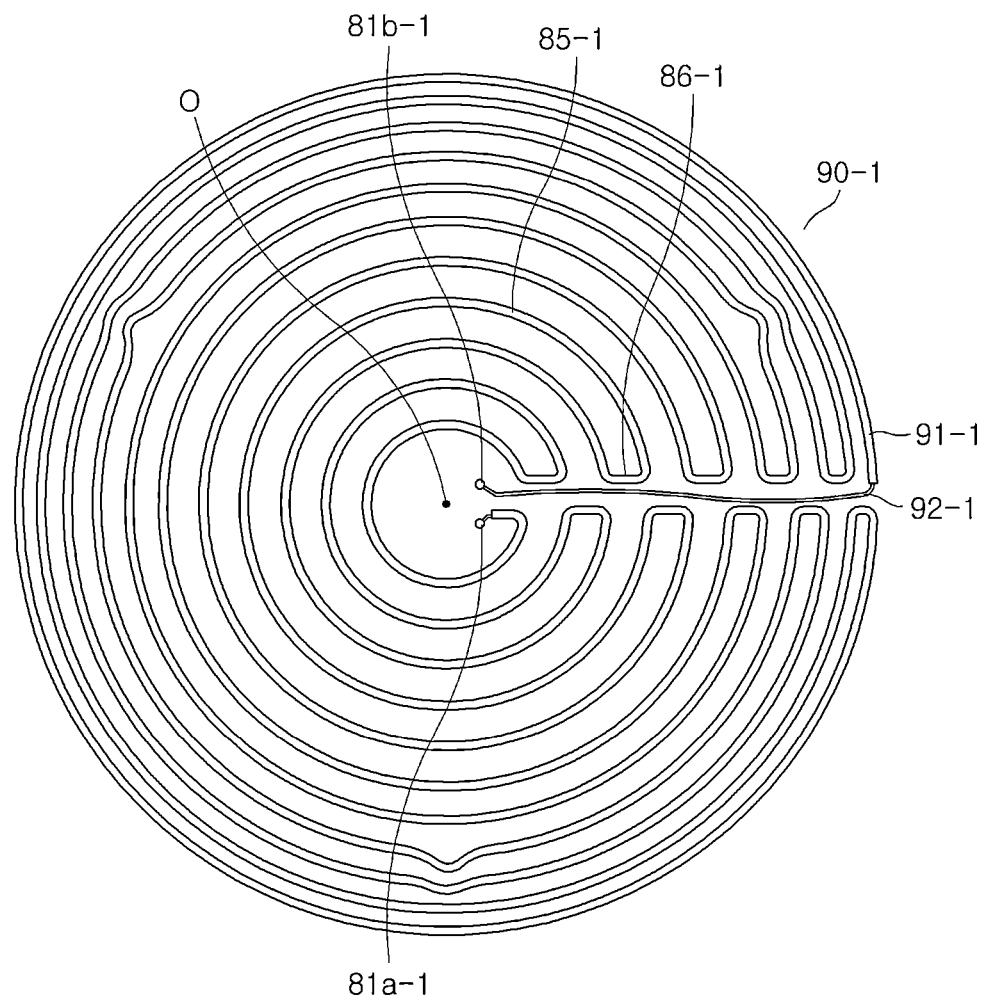

FIGS. 5A to 5D are drawings illustrating an exemplary two-layer structure of heater 114 patterns of a susceptor 100 according to the present disclosure. FIG. 5A illustrates a plan view of heater 114 patterns 90 arranged in a two-layer structure on different planes inside the susceptor 100. FIG. 5B illustrates a schematic stacking structure of an upper first heater layer 511 and a lower second heater layer 512 in the cross-sectional structure in FIG. 5A. FIG. 5c illustrates a plan view of the first heater layer 511 in FIG. 5A. FIG. 5D illustrates a plan view of the second heater layer 512 in FIG. 5A.

Referring to FIGS. 5A to 5D, the heater 114 in a two-layer structure in the susceptor 100 of the present disclosure includes a first heater layer 511 and a second heater layer 512 formed to be spaced a predetermined distance apart from each other with a ceramic material interposed therebetween.

The first heater layer 511 includes a first pattern 90-1 that includes a first resistance part 91-1 and a first connection part 92-1 connected between a terminal pair 81a-1 and 81b-1. In addition, the second heater layer 512 includes a second pattern 90-2 that includes a second resistance part 91-2 and a second connection part 92-2 connected between a terminal pair 81a-2 and 81b-2 on another layer.

In addition, the first connection part 92-1 and the second connection part 92-2 connect ends of the resistance parts 91-1 and 91-2, connected to first terminals 81a-1 and 81a-2, and second terminals 81b-1 and 81b-2, respectively. In addition, the first resistance part 91-1 and the second resistance part 91-2 include a plurality of arcs 85-1 and 85-2 extending in the circumferential direction and bends 86-1 and 86-2 connecting the arcs 85-1 and 85-2, respectively.

Here, the arcs 85-1 of the first resistance part 91-1 and the arcs 85-2 of the second resistance part 91-2 may be arranged in arrangement areas overlapping each other between layers, as shown in FIG. 5A. That is, when the first pattern 90-1 and the second pattern 90-2 are projected onto the plane of the insulating plate 110, that is, when the arcs 85-1 of the first resistance part 91-1 and the arcs 85-2 of the second resistance part 91-2 are projected onto the plane of the insulating plate 110, the arcs 85-2 of the second resistance part 91-2 may be arranged between the arcs 85-1 of the first resistance part 91-1. In this case, the arcs 85-1 of the first resistance part 91-1 and the arcs 85-2 of the second resistance part 91-2 may be arranged at different radial positions from the center O, thereby compensating for the heating temperature between the patterns to increase the temperature uniformity.

In addition, the first connection part 92-1 and the second connection part 92-2 are arranged at positions of radially different angles with respect to the center O. In a structure in which one pattern 90-1 or 90-2 is arranged in each layer as shown in FIG. 5A, it is preferable that the first connection part 92-1 and the second connection part 92-2 are arranged at 180 degrees with respect to the center O in the outer diametric direction.

In FIG. 5A, for example, a heater layer may be configured such that heater 114 patterns are arranged in two or more multi-divided arrangement areas shown in FIGS. 3A to 3D, instead of the first pattern 90-1 of the first heater layer 511. In this case, the second pattern 90-2 may be applied as it is.

In addition, according to the present disclosure, a heater layer may be configured such that heater 114 patterns are arranged in two or more multi-divided arrangement areas shown in FIGS. 3A to 3D, instead of the second pattern 90-2 of the second heater layer 512 in FIG. 5A. In this case, the first pattern 90-1 may be applied as it is.

That is, according to the present disclosure, each heater layer of the two-layer structure of the first heater layer 511 and the second heater layer 512 may be implemented, in the same manner as above, to all combinations of pattern structures including one pattern or heater 114 patterns arranged in two or more multi-divided arrangement areas (the divided arrangement areas may be the same or different between the layers). Furthermore, this principle may also be applied to the case where each heater layer of three- or more-layer structure (see FIG. 7) is implemented, in the same manner as above, as all combinations of pattern structures including one pattern or heater 114 patterns arranged in two or more multi-divided arrangement areas (the divided arrangement areas may be the same or different between the layers).

FIGS. 6A to 6D are drawings illustrating other patterns in a two-layer structure as examples of heater 114 patterns of a susceptor 100 according to the present disclosure. FIGS. 6A to 6D illustrate that heater layers have structures in which the same heater 114 patterns are respectively arranged in arrangement areas, which are divided into two, three, four, and other multiple parts, in a two-layer structure of the first heater layer 511 and the second heater layer 512.

Figure 6A:
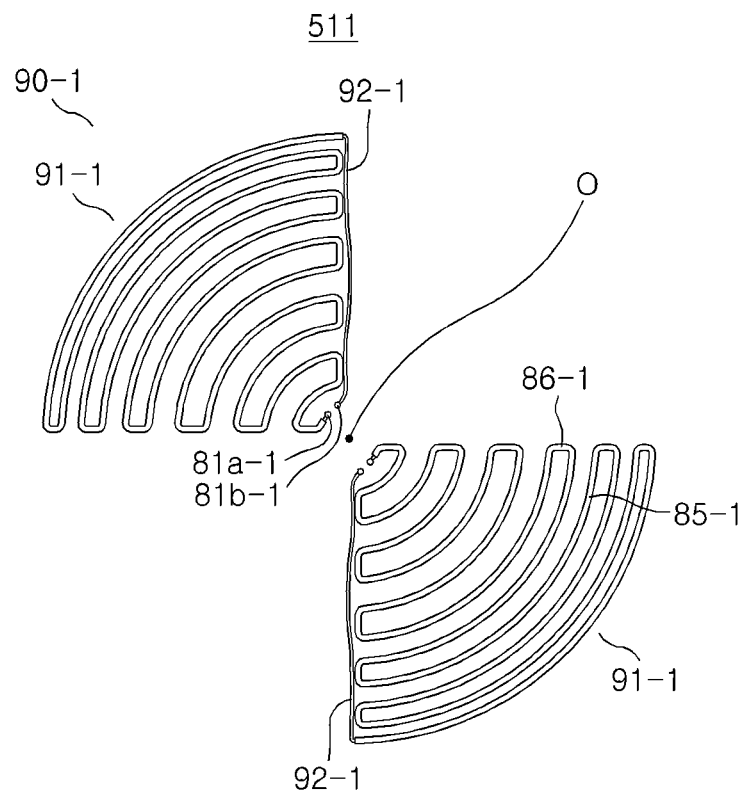
FIGS. 6A to 6D are drawings illustrating other patterns in a two-layer structure as examples of heater patterns of a susceptor according to the present disclosure.
Figure 6A:
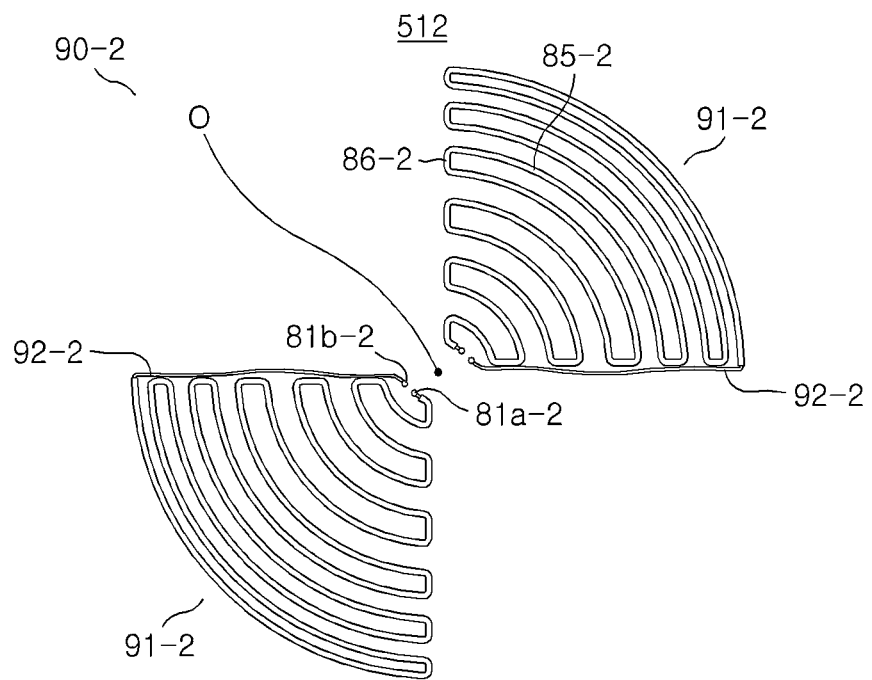
Figure 6B:
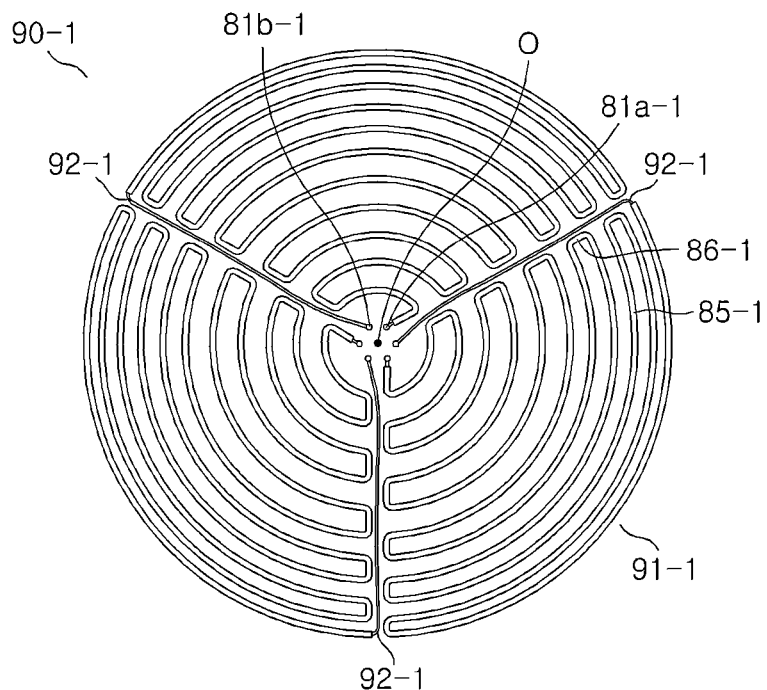
Figure 6B:
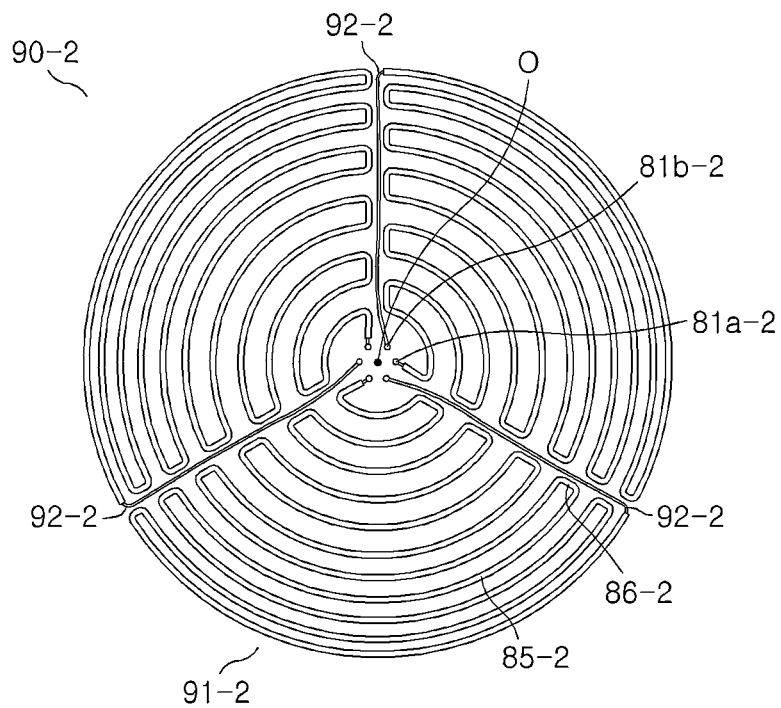
Figure 6C:
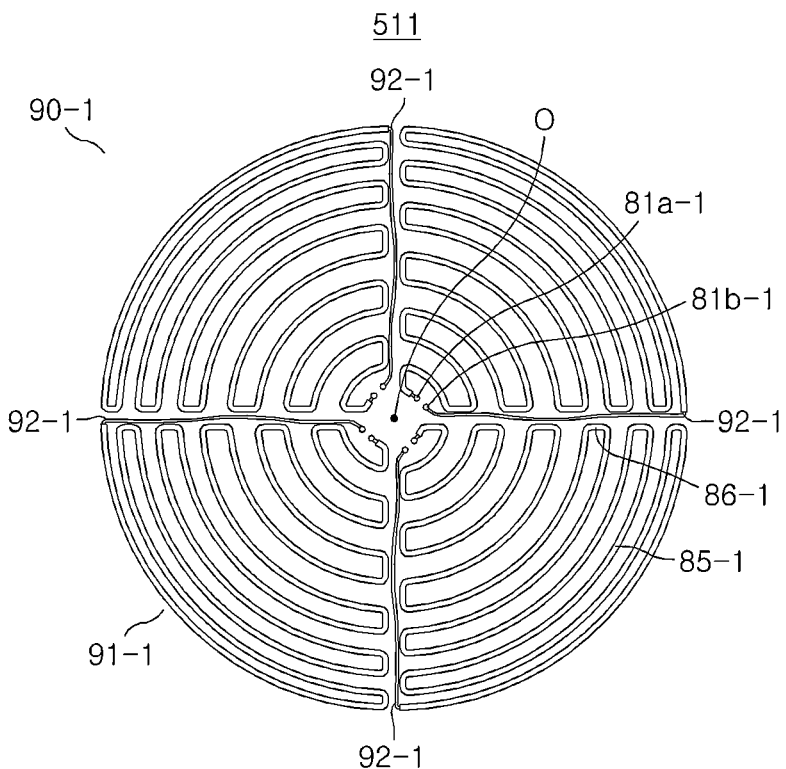
Figure 6C:
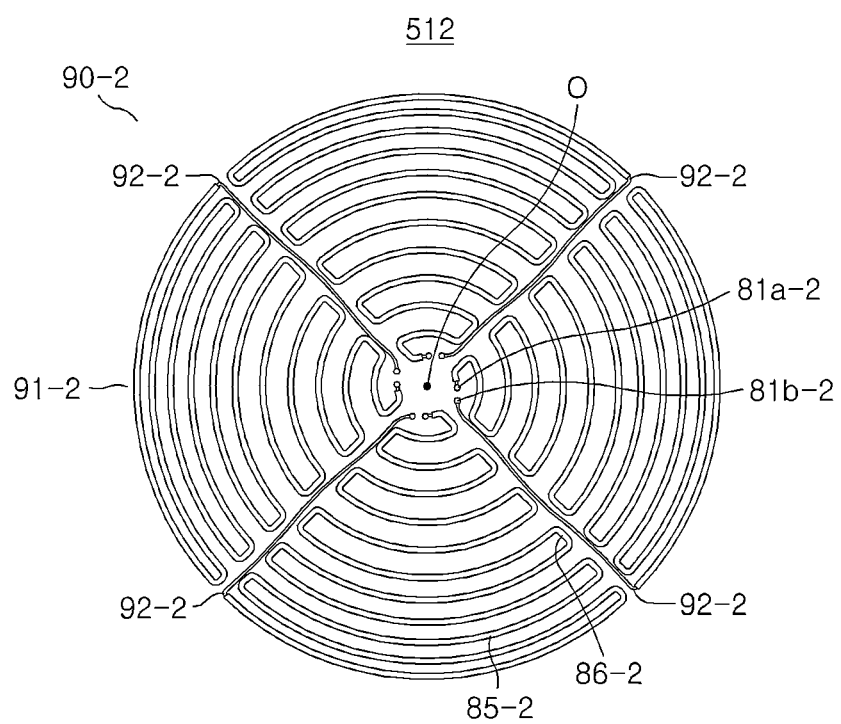
Figure 6D:
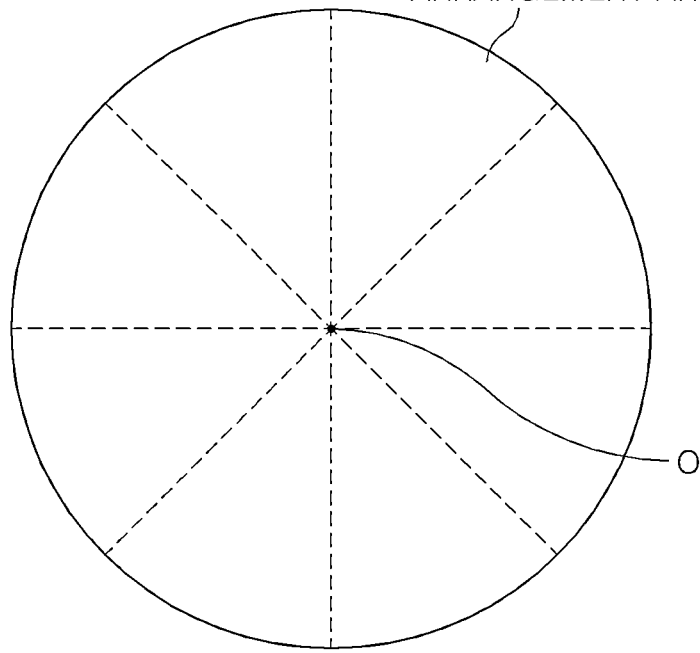
Figure 6D:
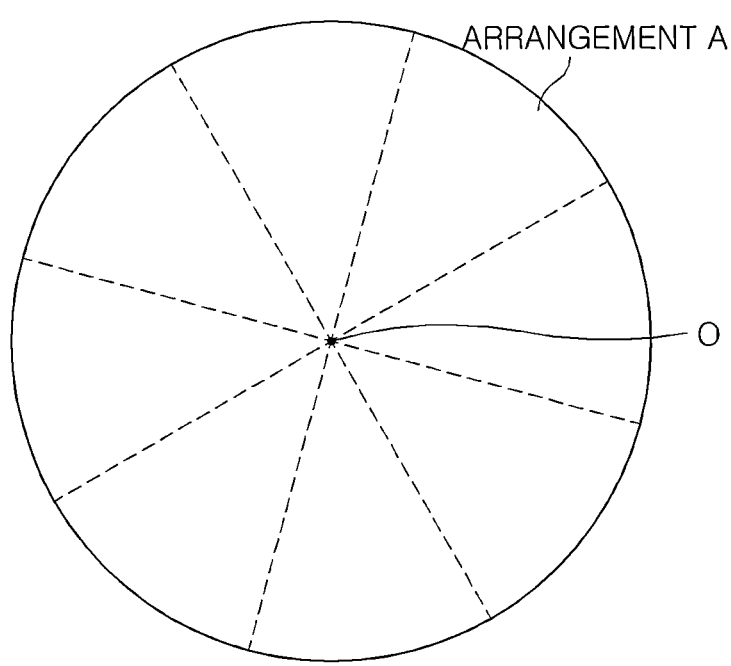

First, referring to FIGS. 6B to 6D, arcs 85-1 of a first resistance part 91-1 included in a first pattern 90-1 of the first heater layer 511 and arcs 85-2 of a second resistance part 91-2 included in a second pattern 90-2 of the second heater layer 512 may be arranged in arrangement areas overlapping each other between layers, as in FIG. 5A. That is, when the first pattern 90-1 and the second pattern 90-2 are projected onto the plane of the insulating plate 110, that is, when the arcs 85-1 of the first resistance part 91-1 and the arcs 85-2 of the second resistance part 91-2 are projected onto the plane of the insulating plate 110, the arcs 85-2 of the second resistance part 91-2 may be arranged between the arcs 85-1 of the first resistance part 91-1 (see FIG. 5A). In this case, the arcs 85-1 of the first resistance part 91-1 and the arcs 85-2 of the second resistance part 91-2 may be arranged at different radial positions from the center O, thereby compensating for the heating temperature between the patterns to increase the temperature uniformity. In addition, a first connection part 92-1 of the first heater layer 511 and a second connection part 92-2 of the second heater layer 512 are arranged at positions of radially different angles with respect to the center O.

In addition, referring to FIG. 6A, the first heater layer 511 and the second heater layer 512 may have the same configurations of the terminal pair 81a and 81b, the arcs 85, the bends 86, the resistance part 91, and the connection part 92 as in FIG. 5A.

However, in this embodiment, the heater 114 may include a first heater layer 511 having one or more first patterns 90-1 including a first resistance part 91-1 and a first connection part 92-1 connected between a terminal pair 81a-1 and 81b-1, and a second heater layer 512 having one or more second patterns 90-2 including a second resistance part 91-2 and a second connection part 92-2 connected between another terminal pair 81a-2 and 81b-2.

In addition, in this embodiment, one or more first patterns 90-1 and second patterns 90-2 are arranged in different arrangement areas without overlapping between the layers (arrangement areas do not overlap). That is, one or more first patterns 90-1 may include arcs 85 that are point-symmetrical about the center O and bends 86 that are point-symmetrical about the center O, and one or more second patterns 90-2 may include arcs 85 that are point-symmetrical about the center O and bends 86 that are point-symmetrical about the center O.

In addition, the first connection part 92-1 of the first heater layer 511 and the second connection part 92-2 of the second heater layer 512 are arranged at positions of radially different angles with respect to the center O, and in particular, it is preferable that two connection parts 92-1 of the first heater layer 511 are arranged at 180 degrees with each other in the outer diametric direction, that two connection parts 92-2 of the second heater layer 512 are arranged at 180 degrees with each other in the outer diametric direction, and that the extension lines of two connection parts 92-1 of the first heater layer 511 and the extension lines of two connection parts 92-2 of the second heater layer 512 are perpendicular to each other.

Figure 7:
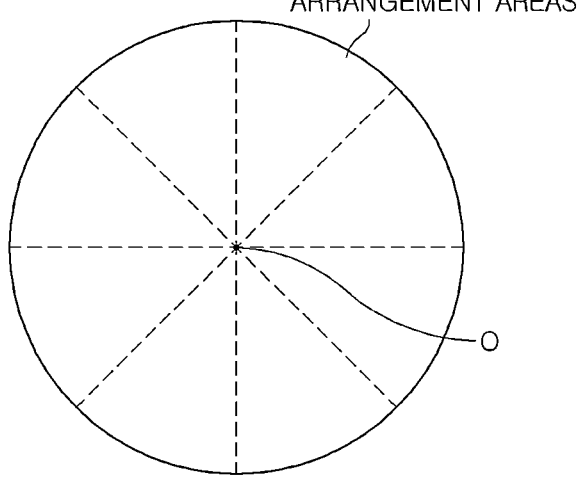
FIG. 7 is a drawing illustrating patterns in a three-layer structure as an example of heater patterns of a susceptor according to the present disclosure.
Figure 7:
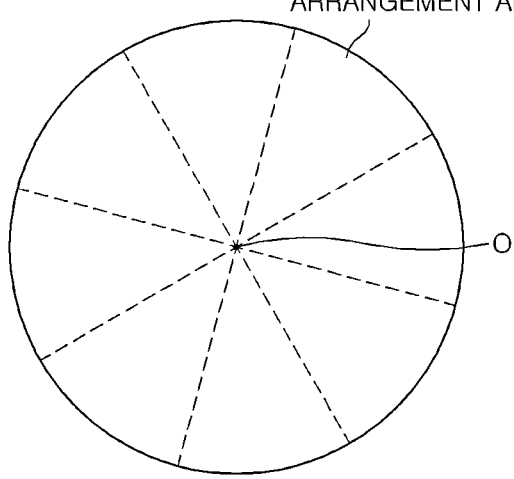
Figure 7:
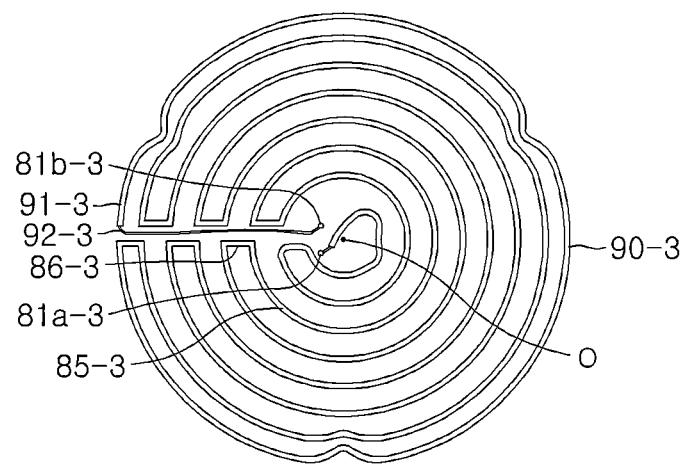

FIG. 7 is a drawing illustrating heater 114 patterns in a three-layer structure as an example of heater 114 patterns of a susceptor 100 according to the present disclosure.

Referring to FIG. 7, the heater 114 of the susceptor 100 of the present disclosure may include the same or similar configurations as the first heater layer 511 and the second heater layer 512 in the embodiments described with reference to FIG. 5A or FIG. 6A to FIG. 6D, and may further include a third heater layer 513 spaced apart from the second heater layer 512 with a ceramic material therebetween.

As described above, each of the first heater layer 511, the second heater layer 512, and the third heater layer 513 may be implemented as all combinations of pattern structures including one pattern or heater 114 patterns arranged in two or more multi-divided arrangement areas (the divided arrangement areas may be the same or different between the layers) described above.

The first heater layer 511 and the second heater layer 512 may have the same configurations as those described with reference to FIG. 5A, and the third heater layer 513 may include a third pattern 90-3 including a third resistance part 91-3 and a third connection part 92-3 connected between a third terminal pair 81a-3 and 81b-3.

The third connection part 92-3 indicates a connecting wire having a wave shape as described above, which connects an end of the resistance part 91-3 connected to a first terminal 81a-3 of the third terminal pair 81a-3 and 81b-3 and a second terminal 81b-3 of the third terminal pair 81a-3 and 81b-3.

The third resistance part 91-3 includes arcs 85-3 extending in the circumferential direction and bends 86-3 connecting the arcs 85-3.

Similar to the two-layer structure in FIG. 5A, the arcs 85-1, 85-2, and 85-3 of the resistance parts 91-1, 91-2, and 91-3 of the first heater layer 511, the second heater layer 512, and the third heater layer 513 may be arranged in arrangement areas overlapping each other between layers, and in this case, may be arranged at different radial positions from each other with respect to the center O. That is, when the first pattern 90-1, the second pattern 90-2, and the third pattern 90-3 are projected onto the plane of the insulating plate 110, that is, when the arcs 85-1 of the first resistance part 91-1, the arcs 85-2 of the second resistance part 91-2, and the arcs 85-3 of the third resistance part 91-3 are projected onto the plane of the insulating plate 110, the arcs 85-3 of the third resistance part 91-3 may be arranged between the arcs 85-2 of the second resistance part 91-2 and the arcs 85-1 of the first resistance part 91-1 (arranged so that the arcs do not overlap each other between three layers). This is to prevent the arcs existing in any two layers of the first heater layer 511, the second heater layer 512, and the third heater layer 513 from overlapping each other. Accordingly, the heating temperature between the patterns may be compensated for, thereby increasing the temperature uniformity.

In addition, the connection parts 92-1, 92-2, and 92-3 of the first heater layer 511, the second heater layer 512, and the third heater layer 513 are arranged at positions of radially different angles with respect to the center O. This may also be applied to adjacent layers among the first heater layer 511, the second heater layer 512, and the third heater layer 513.

As described above, according to the susceptor 100 of the present disclosure, the temperature uniformity may be improved by arranging the multilayer heater 114 patterns such that the arcs do not overlap, so that the heater 114 is evenly distributed over respective areas for heating, and the temperature uniformity may be improved in the entire area of the upper surface of the susceptor by arranging multiple connection parts 92, which are straight sections between layers, not to overlap each other or not to be parallel to each other in the multilayer heater 114 patterns or by arranging two or more connection parts 92, which are straight sections, at different angles with respect to the center in the single-layer heater 114 patterns. In addition, such a structure is able to reduce the occurrence of defects such as cracks due to oxidation of the connection parts 92, which are straight sections, and the temperature is able to be freely controlled in each arrangement area in each layer of the multilayer heater 114 patterns, thereby increasing the degree of freedom of temperature control for temperature uniformity.

As described above, although the present disclosure has been described with specific details such as specific elements, and limited embodiments and drawings, these are provided only to help overall understanding of the present disclosure, and the present disclosure is not limited to the embodiments above, and it is obvious to those skilled in the art to which the present disclosure pertains to make various modifications and variations without departing from the essential characteristics of the present disclosure. Therefore, the idea of the present disclosure should not be limited to the embodiments described above, and all technical ideas derived from the claims described below and equivalent to the claims should be interpreted as being included in the scope of the present disclosure.

What is claimed is:

1. A susceptor comprising an insulating plate having a plurality of heater layers arranged thereon,
wherein the plurality of heater layers comprises: a first heater layer having a first pattern comprising a first resistance part and a first connection part connected between a first terminal pair; and a second heater layer having a second pattern comprising a second resistance part and a second connection part connected between a second terminal pair,
wherein one end of the first resistance part is connected to a first terminal of the first terminal pair, and the first connection part is configured to connect the other end of the first resistance part and a second terminal of the first terminal pair, and the other end of the first resistance part is an end of the first resistance part that is positioned diametrically further outward from a center of the insulating plate than the one end of the first resistance part,
one end of the second resistance part is connected to a first terminal of the second terminal pair, and the second connection part is configured to connect the other end of the second resistance part and a second terminal of the second terminal pair, the other end of the second resistance part is an end of the second resistance part that is positioned diametrically further outward from the center of the insulating plate than the one end of the second resistance part, and
wherein the first connection part and the second connection part extend in a diametric direction with respect to the center of the insulating plate, and each of the first connection part and the second connection part is arranged one by one between adjacent resistance part patterns.

2. The susceptor according to claim 1,
wherein each of the first resistance part and the second resistance part comprises a plurality of arcs extending in a circumferential direction and a plurality of bends configured to connect the arcs, and
wherein, when the arcs of the first resistance part and the arcs of the second resistance part are projected onto a plane of the insulating plate, the arcs of the second resistance part are arranged between the arcs of the first resistance part.

3. The susceptor according to claim 1,
wherein the first connection part and the second connection part are arranged at positions of radially different angles with respect to the center of the insulating plate.

4. The susceptor according to claim 1,
wherein the plurality of heater layers further comprises a third heater layer having a third pattern comprising a third resistance part and a third connection part connected between a third terminal pair,
wherein the third connection part is configured to connect an end of the third resistance part and any one terminal of the third terminal pair, and
wherein the third resistance part comprises a plurality of arcs extending in a circumferential direction and a plurality of bends configured to connect the arcs.

5. The susceptor according to claim 4,
wherein, when the arcs of the first resistance part, the arcs of the second resistance part, and the arcs of the third resistance part are projected onto a plane of the insulating plate, the arcs of the third resistance part are arranged between the arcs of the first resistance part and second resistance part.

6. The susceptor according to claim 4,
wherein the first connection part, the second connection part, and the third connection part are arranged at positions of radially different angles with respect to the center of the insulating plate.

7. The susceptor according to claim 1,
wherein the first pattern and the second pattern are arranged in one or more arrangement areas, which are divided into a same number of parts, respectively.

8. The susceptor according to claim 1,
wherein the first pattern and the second pattern are arranged in one or more arrangement areas, which are divided into different numbers of parts, respectively.

9. The susceptor according to claim 1,
wherein each of the first connection part and the second connection part comprises a connecting wire having a wave shape.

10. The susceptor according to claim 1,
wherein each of the first resistance part and the second resistance part comprises a plurality of arcs extending in a circumferential direction and a plurality of bends connecting the arcs,
wherein the first pattern and the second pattern are arranged in different arrangement areas without overlapping each other between layers, the plurality of arcs are symmetrical about the center, and the plurality of bends are symmetrical about the center, and
wherein the first connection part and the second connection part are arranged at positions of radially different angles with respect to the center.

11. The susceptor according to claim 10,
wherein two connection parts of the first heater layer are arranged at 180 degrees with each other in an outer diametric direction,
wherein two connection parts of the second heater layer are arranged at 180 degrees with each other in the outer diametric direction, and
wherein extension lines of two connection parts of the first heater layer and extension lines of two connection parts of the second heater layer are perpendicular to each other.

12. A susceptor comprising an insulating plate on which a heater is arranged,
wherein the heater comprises patterns arranged in a plurality of divided arrangement areas, respectively, on a same plane, each of the patterns comprising a resistance part and a connection part connected between a terminal pair,
wherein one end of the resistance part is connected to a first terminal of the terminal pair, and each connection part is configured to connect the other end of the resistance part and a second terminal of the terminal pair, and the other end of the resistance part is an end of the resistance part that is positioned diametrically further outward from a center of the insulating plate than the one end of the resistance part, and wherein the connection parts extend in a diametric direction with respect to the center of the insulating plate and are arranged one by one between adjacent resistance part patterns.

13. The susceptor according to claim 12, wherein the connection parts of the patterns are arranged at positions of radially different angles from each other with respect to the center of the insulating plate.

14. The susceptor according to claim 12, wherein the connection part of each pattern comprises a connecting wire having a wave shape.

\* \* \* \* \*